US 6,567,956 B1

(12) United States Patent
Rakel

(10) Patent No.: US 6,567,956 B1
(45) Date of Patent: May 20, 2003

(54) METHOD FOR PERFORMING ELECTRICAL RULES CHECKS ON DIGITAL CIRCUITS WITH MUTUALLY EXCLUSIVE SIGNALS

(75) Inventor: Ted Scott Rakel, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/566,765

(22) Filed: May 8, 2000

(51) Int. Cl.[7] .............................................. G06F 17/50
(52) U.S. Cl. .............................................. 716/4; 716/5
(58) Field of Search ............... 716/1–6, 18; 703/13–15; 714/25, 33, 37

(56) References Cited

U.S. PATENT DOCUMENTS 4,510,572 A * 4/1985 Reece et al. .................... 716/4
5,157,668 A * 10/1992 Buenzli et al. ................. 716/4
6,263,476 B1 * 7/2001 Browen et al. ................. 716/4
6,449,752 B1 * 9/2002 Baumgartner et al. ......... 716/5

* cited by examiner

Primary Examiner—Matthew Smith
Assistant Examiner—Paul Dinh

(57) ABSTRACT

A method for reducing false electrical rule violations during the analysis of a digital circuit having mutually exclusive signal relationships therein. The use of designer knowledge about signals which are mutually exclusive in the circuit design is employed to determine, based on all relevant mutually exclusive signal relationships in the circuit design under test, all possible permutations of active signals used in the analysis. For each permutation, the analysis is performed using the active signals associated with the permutation while ignoring the effect of all signals that are inactive based on the mutually exclusive signal relationships. The invention may be applied to any digital circuit test wherein the effect of mutually exclusive signal relationships affects the outcome of the analysis.

8 Claims, 5 Drawing Sheets

US 6,567,956 B1

METHOD FOR PERFORMING ELECTRICAL RULES CHECKS ON DIGITAL CIRCUITS WITH MUTUALLY EXCLUSIVE SIGNALS

FIELD OF THE INVENTION

The present invention pertains generally to electronic circuit testing, and more particularly to a method for reducing false electrical rule violations during the testing of a digital circuit design by making use of designer knowledge about signals which are mutually exclusive in the circuit design.

BACKGROUND OF THE INVENTION

The semiconductor industry continues to yield integrated circuits (ICs) of increasing density in order to reduce their overall required chip space and therefore allow circuit designs of increasing complexity. At the present time, such ICs can implement complex circuit designs with up to millions of transistors.

Due to the sheer volume of transistors and complexity of modern day circuit designs, the testing of such circuit designs prior to actual implementation requires increasingly complex testing tools. These testing tools typically operate on a net list file describing a schematic of the circuit design, which specifies the components, nodes, connections of the components between the nodes, and relative sizes of each of the components. Logic and timing analysis is performed via computer simulations of the circuit design. Given a set of specifications, or electrical rules checks (ERCs), a test will run the analysis and output violations of the specifications.

Present day testing tools are limited to generating specification violations for every violation of the electrical rules checks, without regard to the impossibility of such a violation due to signals in the circuit that are mutually exclusive. Accordingly, "false" ERC violations are often reported for signal combinations that cannot actually occur. In a large design, this can result in the reporting of a considerably large number of "false" ERC violations, which get reported to the designers from the testers. Upon investigation, the designers determine that the "false" ERC violations are not really violations at all because the combination of signals that result in the violation cannot actually occur because the signals are mutually exclusive. Accordingly, it will be appreciated that the reporting of false ERC violations results in loss of both designer and tester time, and is thus undesirable.

Accordingly, a need exists for a way to communicate mutually exclusive signal information to the testing tool to avoid reporting of ERC violations that cannot in fact occur due to mutually exclusive signals.

SUMMARY OF THE INVENTION

The present invention is a novel method for reducing the reporting of false ERC violations by a testing tool during the testing of a digital circuit design having mutually exclusive signals. In accordance with the method of the invention, all relevant mutually exclusive signal relationships in the circuit design under test are determined. Then, based on the relevant mutually exclusive signal relationships, all possible permutations of active signals used in the analysis are determined. For each possible permutation, the analysis is performed using the active signals associated with the permutation while ignoring the effect of all signals that are inactive based on the mutually exclusive signal relationships.

In a preferred embodiment, the list of relevant mutually exclusive signal relationships in the circuit design under test is performed by obtaining a list of mutually exclusive signal relationships in the circuit, determining a set of signals that are relevant to the circuit, and creating a mutex list comprising each of the mutually exclusive signal relationships in the circuit that include at least two of the signals that are relevant to the circuit. Also in the preferred embodiment, the list of all possible permutations of active signals used in the analysis is performed by creating an active signal list, that comprises one or more active signal elements that each comprise a different permutation of the relevant signals and that also does not include any of the mutually exclusive signal relationships contained in the mutex list.

In accordance with the apparatus of the invention, an electrical rules checker for detecting violations of a set of electrical rules in a digital circuit design includes a mutex list generator which reads a mutex file containing a set of mutually exclusive signal relationships of the circuit design. The electrical rules checker also includes an active signal generator which calculates a set of active signal permutations relevant to the circuit that also do not include any of the mutually exclusive signal relationships. A test controller then causes a test to be applied to the circuit design at least once for each different active signal permutation in the set of active signal permutations.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A method for reducing the reporting of false electrical rules check violations by a testing tool during the testing of a digital circuit design having mutually exclusive signals is described in detail hereinafter. The method is described in conjunction with a specific example of a dynamic logic pre-charge node subcircuit example implementing a 4-input logical AND-OR function. This example is presented for illustrative purposes only and not by way of limitation, and the inventive principles described herein extend to any digital circuit or subcircuit thereof having mutually exclusive signal relationships therein. In addition, the method is also described in conjunction with the analysis of the subcircuit using a specific test, namely, a "charge leakage" test. Again, this test is presented for illustrative purposes only and not by way of limitation, and the inventive principles described herein extend to the analysis of any digital circuit or subcircuit thereof having mutually exclusive signal relationships therein using any test wherein the effect of mutually exclusive signal relationships affects the outcome of the analysis.

Figure 1:
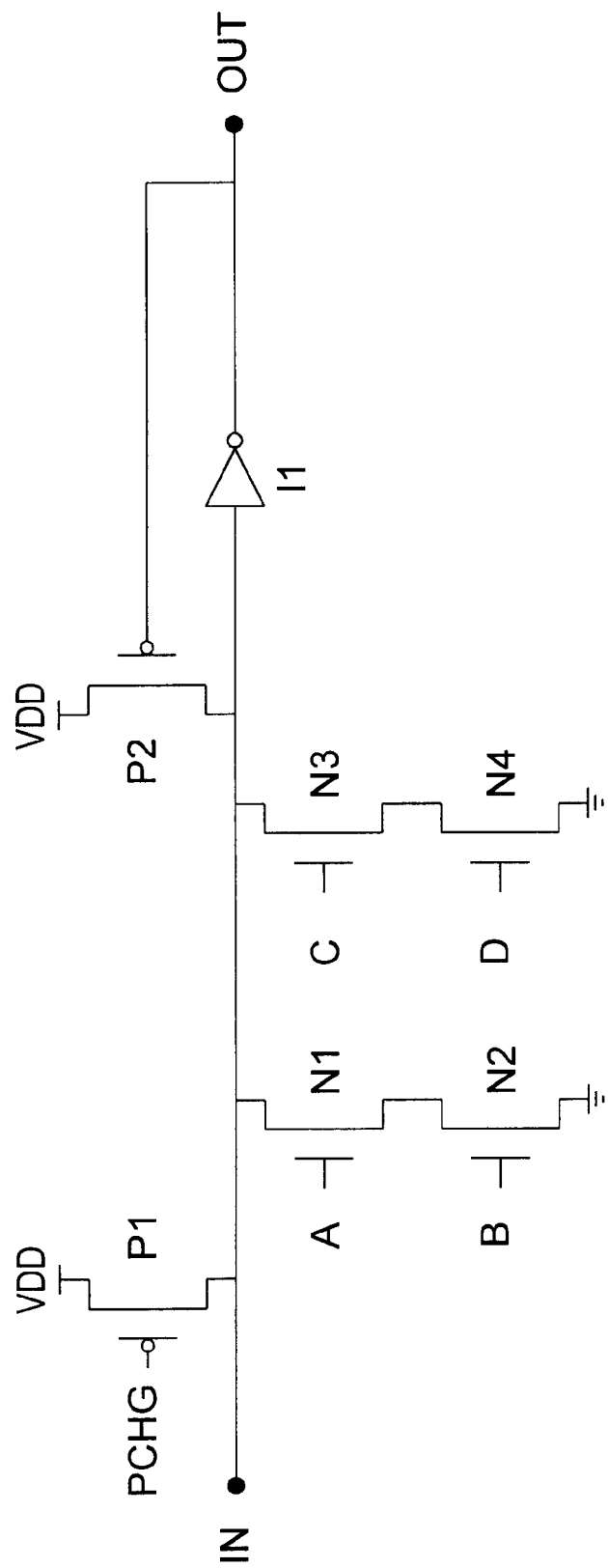
FIG. 1 is a schematic diagram of a precharge node subcircuit.

FIG. 1 is an example of a well-known precharge node subcircuit 10 that might be found in a larger dynamic logic circuit, and is presented herein for illustrative purposes only and not by way of limitation. As illustrated, pre-charge node subcircuit 10 implements a logical AND-OR function because in order to pull down pre-charged node N0, either A and B, or C and D, must both be on. Thus, output node NOUT goes high (logically true) only when neither A and B are both true, nor C and D are both true. In particular, as known by those skilled in the art, node N0 is precharged high by FET P1 during a pre-charge phase; thus, output node NOUT is held low by inverter 11 and held stable by FET P2 as will be recognized as a conventional stability technique by those skilled in the art. During an evaluate phase, precharge FET P2 is turned off, thereby allowing precharged node N0 to be pulled down if either inputs A and B, or inputs C and D are respectively both logically true. When an input A, B, C, or D is logically true, a high-level voltage is presented at the gate of the respective FET N1, N2, N3, or N4, thereby operating to turn on the respective FET. Thus, if A and B are both logically true, FETs N1 and N2 will both turn on, causing the precharged node N0 to discharge to ground and the output node NOUT to go high. Likewise, if input signals C and D are both logically true, FETs N3 and N4 will both turn on, causing the precharged node N0 to discharge to ground and the output node NOUT to go high.

One analysis test that is typically performed on such a circuit is a "charge leakage" test, wherein the relative strengths (or "sizes") of the FETs implementing the logic function (i.e., FETs N1, N2, N3, and N4) are analyzed to determine whether in a worst case scenario, they will be able to hold the charge on precharged node N0. In the example of FIG. 1, the FETs must be able to hold the charge on node N0 when any of inputs A or B and C or D are true. As known in the art, even in cutoff a small leakage current is produced between the source and drain of a transistor. The larger the size (or width) of the transistor, the more leakage current produced. Accordingly, in a worst case scenario, one of N1 and N2 and one of N3 and N4 will have to hold the charge on precharged node N0. The charge leakage test examines the relative sizes of the transistors N1, N2, N3, and N4, to determine what the worst case combined FET strength is for holding the charge. Because N1 and N2, and N3 and N4, are coupled in parallel, the FET strengths of the off FETs are added together for the analysis. As an example of the function of the charge leakage test, suppose the relative strengths of FETs N1, N2, N3, and N4 are 2, 4, 6, and 8 respectively. In this example, the worst case scenario (without any information regarding mutually exclusive relationships of the signals A, B, C and D) occurs when only B and D are off, requiring N2 (with strength 4) and N4 (with strength 8) to hold the charge on node N0 with a combined strength of 12. The next worst case scenario occurs when only A and D are off, requiring N1 and N4 to hold the charge on node N0 with a combined strength of 10. If the charge leakage test signals an ERC violation for any combined signal strength of 10 or greater, both violations will be reported. However, if it turns out that signals B and D are mutually exclusive, the reporting of the violation of the N2 and N4 combination is actually "false"

Figure 2:
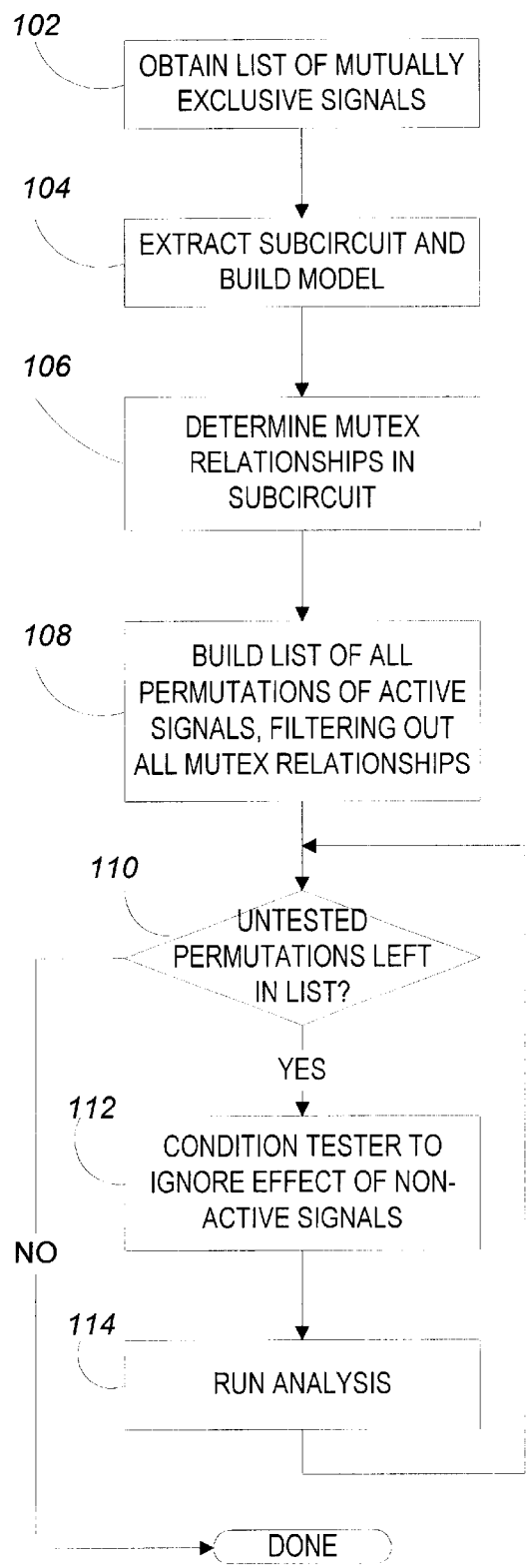
FIG. 2 is an operational flowchart of a method in accordance with the invention.
Figure 3:
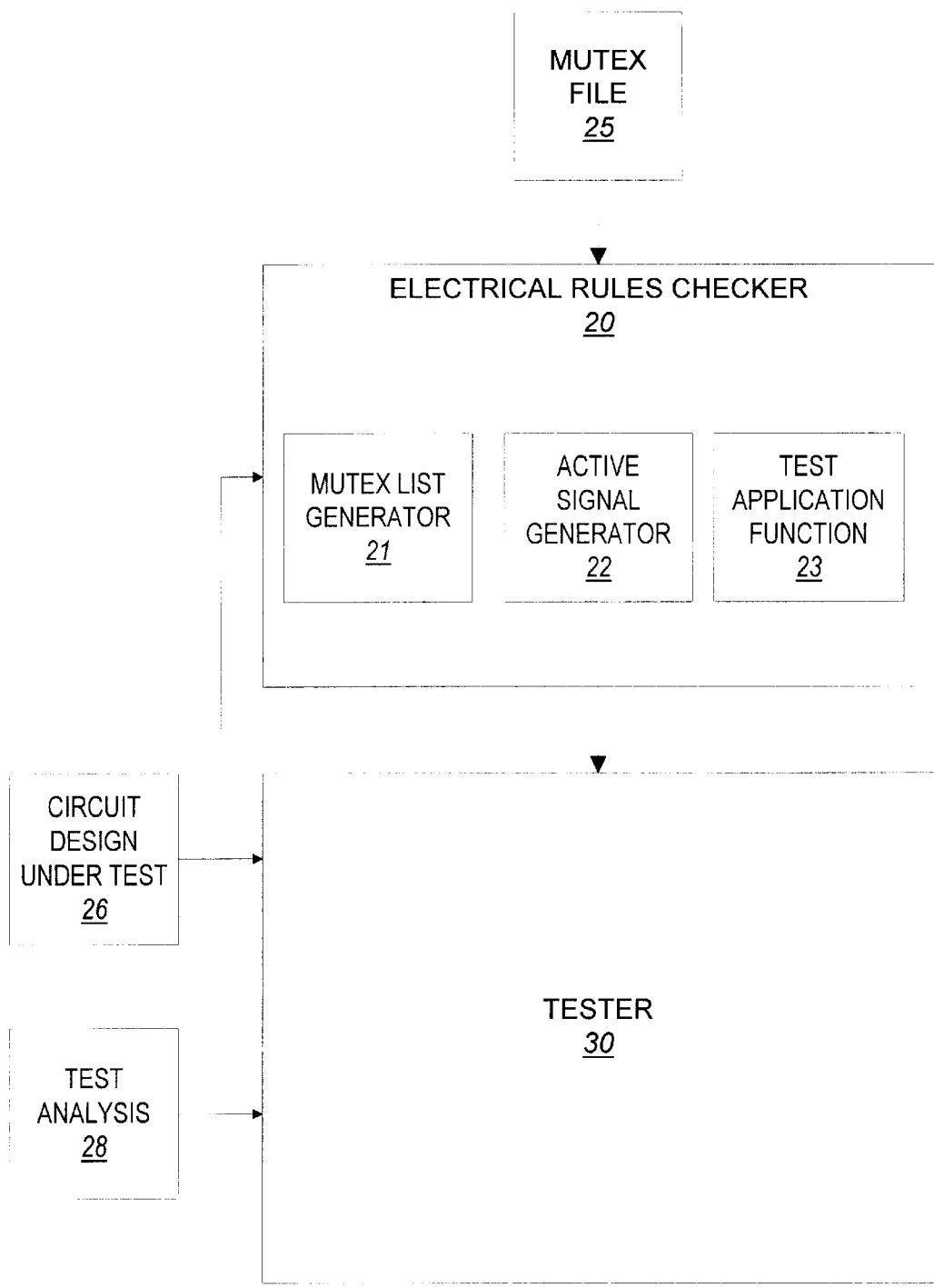
FIG. 3 is a block diagram of a test system implemented in accordance with the invention.

The designers are aware of which signals in the circuit design are mutually exclusive. The present invention uses this knowledge of mutually exclusive signals in the circuit design to prevent the reporting of "false" ERC violations by the testing tool. FIG. 2 is an operational flowchart of the method of the invention, and FIG. 3 is a block diagram of a test system implemented in accordance with the invention. As illustrated in the flowchart of FIG. 2, the mutually exclusive signals in the circuit design under test are obtained 102. In the illustrative embodiment, the circuit designers enter all known mutually exclusive signals in an ASCII file 25 which is read by an electrical rules checker (ERC) 20. The ERC builds 104 a model of the circuit design, or an extracted subcircuit thereof, and finds 106 the mutually exclusive signal relationships relevant to the circuit or subcircuit (hereinafter subcircuit) under test. The ERC then calculates 108 all of the active signal permutations of the signals relevant to the subcircuit under test, but not including any of the mutually exclusive signal combinations that were found in step 106. Then, for each untested active signal permutation calculated in step 108, as determined in step 110, the tester 30 is conditioned 112 to ignore the effect of any signal not included in the active signal permutation, and the test is run 114 applying the particular active signal permutation for that iteration 110. In this manner, none of the ERC violations detected will include "false" violations due to mutually exclusive signal relationships as long as the relationship was included in the mutex file 25. It will be appreciated that this invention thereby reduces the debug time of a circuit design by eliminating the time required for investigation of "false" ERC violations due to mutually exclusive signal relationships.

Applying the invention to the AND-OR gate precharge node subcircuit 10 of FIG. 1, suppose that the designer knows that the signals A and C are mutually exclusive and that the signals B and D are mutually exclusive. Accordingly, the designers communicate this known information to the ERC tool 20 via mutex file 25. ERC 20 reads mutex file 25 and creates a list of mutually exclusive signals for the subcircuit under test. In the illustrative embodiment, ERC 20 extracts a logic subcircuit for each pre-charge node in the design. In the illustrative embodiment, the pre-charge node subcircuit 10 is modeled by the tester 30 in a conventional manner. The ERC 20 determines the relevant signals of the subcircuit 10, which include input signals A, B, C, and D. The mutually exclusive signal relationships relevant to the subcircuit 10 are extracted from the mutex file 25, thereby communicating to the ERC 20 that there are mutex signal relationships including A and C, and B and D, applicable to the testing of subcircuit 10. ERC 20 then builds a list of allowable active signal combinations applicable to subcircuit 10. The active signal list.includes A and B, A and D, C and B, and C and D. The active signal list notably does not include impossible signal combinations including A and C, or B and D. ERC 20 then runs the test once for each active signal combination and reports any violations detected during the running of the tests.

Figure 4:
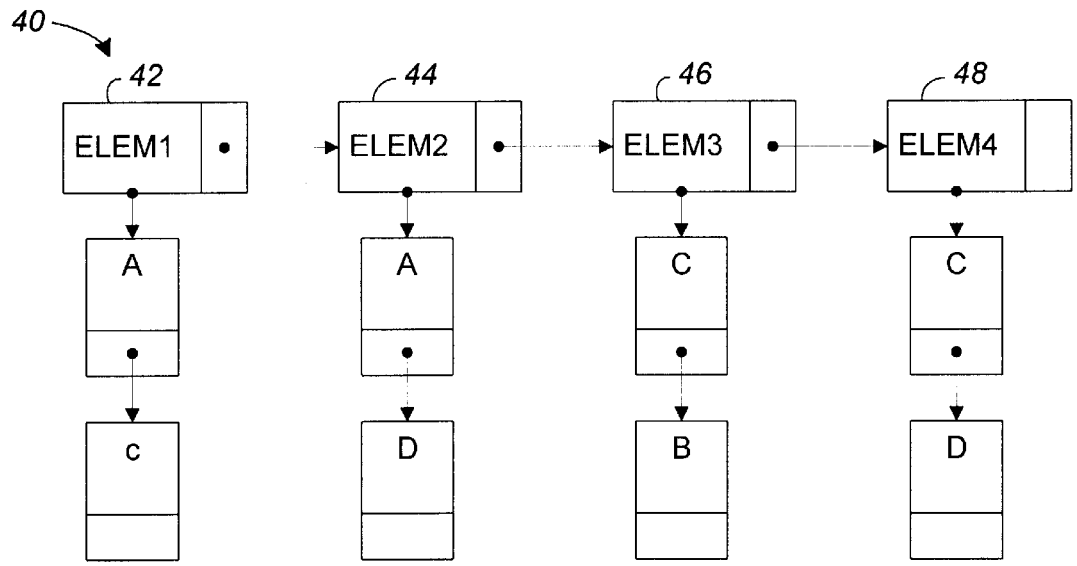
FIG. 4 is a block diagram of an active signal list for the subcircuit of FIG. 1.

Appendix A contains a software implementation written in C of one illustrative embodiment for implementing the invention. This embodiment includes a top-level routing called build_mutex_list build_mutex_list returns an active signal list for a given subcircuit under test. Each element in the active signal list includes a list of "active" signals that are to be included in the analysis for one iteration of the test. The number of elements in the active signal list is corresponds to the number of iterations that the test will be run, each time with a different set of "active" signals corresponding to one element in the list. The number of elements in the active signal list depends on the number of permutations of relevant mutually exclusive signal relationships in the subcircuit under test. Accordingly, in the example of FIG. 1, there are four elements in the active signal list 40, shown in FIG. 4. The first element 42 in the list 40 includes the permutation including active signals A and B; the second element 44 includes the permutation including active signals A and D; the third element 46 includes the permutation including active signals C and B; and the fourth element 48 includes the permutation including active signals C and D.

Build_mutex_list calls a routine called build_circuit_mutex_list in order to examine the circuit under test and determine which mutually exclusive signal relationships are relevant to the analysis. Build_circuit_mutex_list examines all the signals in the circuit under test and returns a circuit mutex list, which includes a linked list of all signals relevant to the subcircuit under test that have a mutually exclusive relationship to another signal in the subcircuit. In the example of FIG. 1, build_circuit_mutex_list returns a circuit mutex list 50, shown in FIG. 5, with two elements including a first element 52 identifying the mutually exclusive relationship between signals A and C and a second element 54 identifying the mutually exclusive relationship between signals B and D.

Figure 5:
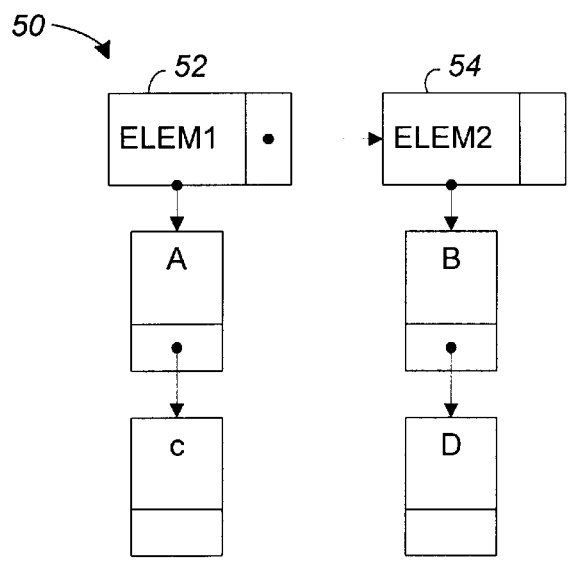
FIG. 5 is a block diagram of a mutex list for the example subcircuit of FIG. 1.

Routing calc_num_mutex_lists calculates the total number of elements needed in the active signal list 40 based on the contents of the circuit mutex list 50. The number of elements need in the active signal list 40 is calculated by stepping along the circuit mutex list 50 and accumulating a total count. The total count is initialized to zero, and the list pointer points to the first link in the circuit mutex list 50 and increments the total count for each entry in the first element. The list pointer is then incremented to point to the next link in the circuit mutex list 50, and the total count is incremented for each entry in the second element. This process is repeated for each element in the circuit mutex list 50. In the example of FIG. 5, there are two mutually exclusive signals (A and C) in the first element 52. Accordingly, the total count is incremented twice. There are two mutually exclusive signals (B and D) in the second element 54. Accordingly, the total count is increment twice more. Thus, the final total count is 4, corresponding to the number of entries that the active signal list 40 will contain.

Figure 6A:
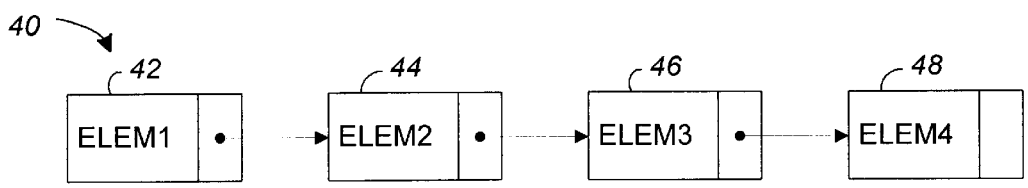
FIGS. 6A–6C are block diagrams of the various stages of creation of an active signal list for the example subcircuit of FIG. 1.

Once the number of entries in the active signal list 40 is calculated, a linked list is created by routine create_mutex_lists with a number of entries equal to the number of entries calculated by the calc_num_mutex_lists routine. This is illustrated in FIG. 6A. Create_mutex_lists then enters the active signals into the active signal list 40 by repeatedly running through the active signal list and simultaneously running through the circuit mutex list 50. A repeat count is used to determine how many successive times across the active signal list a particular active signal is deposited. The repeat count starts at 1. There are three loops in this routine:

loop A—an outermost while loop (over the circuit mutex list)

loop B—an inner for loop (over the active signal list of elements)

loop C—an innermost for loop (over the repeat count)

Figure 6B:
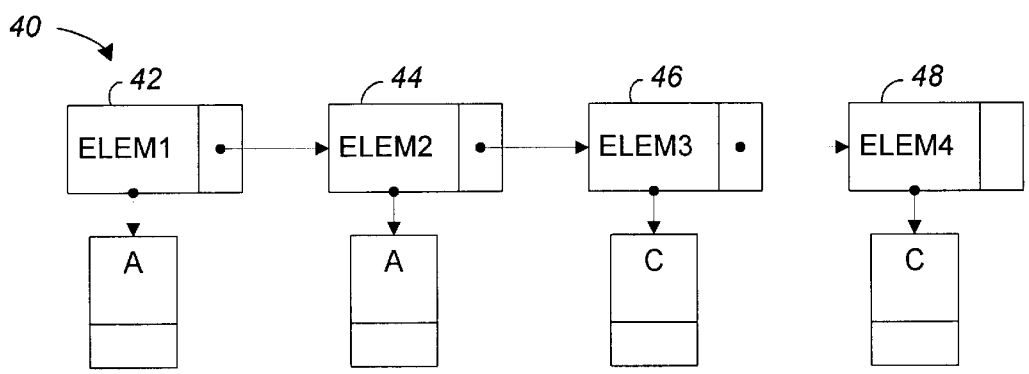

The outermost loop (loop A) steps through the circuit mutex list. There are two for loops nested within the outermost loop. The outer for loop (loop B) iterates as many times as there are elements in the active signa list 40 (in this case 4 times). Each one of the active signal list elements is visited to add a sub-element (if appropriate). The inner loop (loop C) counts the number of elements in the active signal list into which to deposit this signal. Thus, after the first iteration through the outermost loop, the active signal list 40 contains the elements and sub-elements shown in FIG. 6B.

Figure 6C:
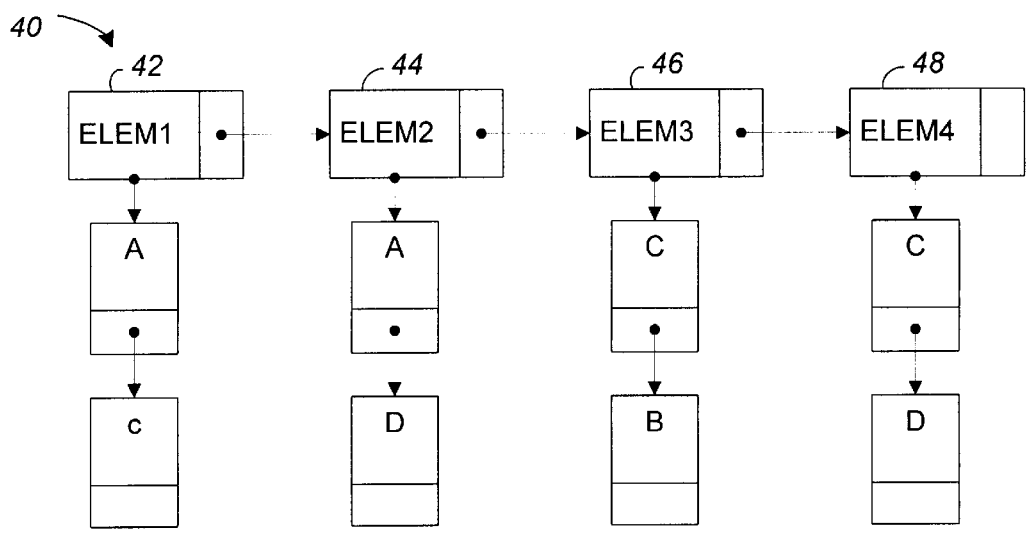

At the end of the outermost for loop (loop B), the repeat count is updated to repeat_count=repeat_count * count_node_nutexes for this link in the circuit mutex list. In this example, this link has the list A→B, so count_node_mutexes returns 2, and repeat_$_{count=}$1*2=2. After the second iteration through the outermost loop, the active signal list 40 contains the elements and sub-elements shown in FIG. 6C.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for reducing "false" electrical rules check (ERC) violations during an analysis of a digital circuit design under test having mutually exclusive signals, comprising:

determining all relevant mutually exclusive signal relationships in said circuit design under test;

determining, based on said relevant mutually exclusive signal relationships, all possible permutations of active signals used in said analysis; and for each said possible permutations, performing said analysis on said active signals associated with said permutation while ignoring the effect of all signals that are inactive based on said mutually exclusive signal relationships.

2. A method in accordance with claim 1, wherein:

said step of determining all relevant mutually exclusive signal relationships in said circuit design under test comprises:

obtaining a list of mutually exclusive signal relationships in said circuit;

determining a set of signals that are relevant to said circuit; and creating a mutex list comprising each of said mutually exclusive signal relationships in said circuit that include at least two of said signals that are relevant to said circuit.

3. A method in accordance with claim 2, wherein:

said step of determining all possible permutations of active signals used in said analysis comprises:

creating an active signal list, said active signal list comprising one or more active signal elements each comprising a different permutation of said relevant signals that does not include any of said mutually exclusive signal relationships contained in said mutex list.

4. A method in accordance with claim 1, wherein:

said circuit design under test is a subcircuit of a larger circuit design.

5. An electrical rules checker for detecting violations of a set of electrical rules in a digital circuit design, comprising:

a mutex list generator which reads a mutex file containing a set of mutually exclusive signal relationships of said circuit design;

an active signal generator which calculates a set of active signal, permutations relevant to said circuit design that do not include any of said mutually exclusive signal relationships; and a test application function that applies each permutation in said set of active signal permutations to a tester running an analysis of said circuit design at least once for each different active signal permutation in said set of active signal permutations.

6. A computer readable storage medium tangibly embodying program instructions for reducing "false" electrical rules check (ERC) violations during an analysis of a digital circuit design under test having mutually exclusive signals, comprising:

determining all relevant mutually exclusive signal relationships in said circuit design under test;

determining, based on said relevant mutually exclusive signal relationships, all possible permutations of active signals used in said analysis; and for each said possible permutations, performing said analysis on said active signals associated with said permutation while ignoring the effect of all signals that are inactive based on said mutually exclusive signal relationships.

7. A computer readable storage medium in accordance with claim 6, wherein:

said step of determining all relevant mutually exclusive signal relationships in said circuit design under test comprises:

obtaining a list of mutually exclusive signal relationships in said circuit;

determining a set of signals that are relevant to said circuit; and creating a mutex list comprising each of said mutually exclusive signal relationships in said circuit that include at least two of said signals that are relevant to said circuit.

8. A computer readable storage medium in accordance with claim 7, wherein:

said step of determining all possible permutations of active signals used in said analysis comprises:

creating an active signal list, said active signal list comprising one or more active signal elements each comprising a different permutation of said relevant signals that does not include any of said mutually exclusive signal relationships contained in said mutex list.

* * * * *

UNITED STATES PATENT AND TRADEMARK OFFICE
CERTIFICATE OF CORRECTION

PATENT NO. : 6,567,956 B1
DATED : May 20, 2003
INVENTOR(S) : Ted Scott Rakel

It is certified that error appears in the above-identified patent and that said Letters Patent is hereby corrected as shown below:

<u>Column 3,</u>
Line 62, after "false" insert a period

<u>Column 6,</u>
Line 16, after "hereto." insert the material which comprises "APPENDIX A" and begins below:

```
APPENDIX A int exists_in_mutexlist(source_node, target_node, mutex1)
node_pr source_node, target_node;
int mutex1;
{
    nodelinkptr this_link;

this_link = mutex1 ? source_node->mutex1 : source_node->mutex0;
    while (this_link) {
        if (this_link->mutex_node == target_node)
            return TRUE;
        this_link = this_link->next;
    }
    rutrn FALSE;
} int append_mutex_link(source_node, target_node, mutex1)
node_pr source_node, target_node;
{
    nodelinkptr new_link;

if (NSame(source_node, target_node)) return;

new_link = malloc(sizeof(struct nodelink));
    if (new_link == NULL) {
        erc_die("ERC: FATAL_ERROR: couldn't malloc|n");
        fatal_error(1);
    }
    new_link->next = mutex1 ? source_node->mutex1 : source_node->mutex0;
    new_link->mutex_node = target_node;
    if (mutex1)
        source_node->mutex1 = new_link;
    else
        source_node->mutex0 = new_link;
} int count_node_mutexes(linst_head, mutex1)
node_pr list_head;
Int mutex1;
{
    nodelinkptr list_pr = mutex1? list_head->mutex1 : list_head->mutex0;
    int count = 0;

while (list_pr) {
        count++;
        list_pr = list_pr->next;
    }
    return count;
} void build_ckt_mutex(top_of_tree_ptr, current_top_ptr, list_head, mutex1)
dinodeptr top_of_tree_ptr, current_top_ptr;
node_pr* list_head;
int mutex1;
```

UNITED STATES PATENT AND TRADEMARK OFFICE
CERTIFICATE OF CORRECTION

PATENT NO.   : 6,567,956 B1
DATED        : May 20, 2003
INVENTOR(S)  : Ted Scott Rakel It is certified that error appears in the above-identified patent and that said Letters Patent is hereby corrected as shown below:

Column 6 (cont'd),

```
        nodelinkptr this_node_mutexes;
        node_pr new_node;
        dinodeptr node_loc_in_tree;
        node_pr this_node = current_top_ptr->gate;

if (current_top_ptr->ignore == TRUE) reutrn;

this_nodemutexes = mutex1 ? this_node->mutex1 : this_node->mutex0;
        if (this_node_mutexes == NULL) {
            current_top_ptr->ignore = TRUE;
            return;
        }
        /* For mutex1 A B C, we have found one of these nodes in the tree.  We want to create a
    node with
            mutex1 |->A->B->C     This is a circuit mutex for this tree */
            new_node = calloc(1, sizeof (struct mynode));
        if (new_node == NULL) {
            erc_die("ERC: FATAL_ERROR: couldn't malloc\n");
            fatal_error(1);
        } append_mutex_link(new_node, this_node, mutex1);
        while(this_node_mutexes) {
            node_loc_in_tree = find_gatenode_in_tree(top_of_tree_ptr, this_node_mutexes->mu
            if (node_loc_in_tree != NULL) {
                append_mutex_link(new_node, this_node_mutexes->mutex_node, mutex1);
                node_loc_in_tree->ignore = TRUE;
            }
            this_node_mutexes = this_node_mutexes->next;
        }
        if (*list_head != NULL) {
            (*list_head)->next = new_node;
            complain("; ERC mutex processing found a circuit with multiple mutex relationship")
        }
        else {
            /* This is the first circuit mutex list for this circuit. */
        }
        current_top_ptr->ignore = TRUE;
    } node_pr build_ckt_mutex_list(top_of_tree_ptr, list_head, mutex1)
    dinodeptr top_of_tree_ptr;
    int mutex1;
    node_pr* list_head;
    {
        dinodeptr current_top_ptr;

current_top_ptr = top_of_tree_ptr;
        while(current_top_ptr) {
            if (current_top_ptr->down) {
                build_ckt_mutex(top_fo_tree_ptr, current_top_ptr->down, list_head, mutex1)
            }
            build_ckt_mutex(top_of_tree_ptr, current_top_ptr, list_head, mutex1);
            current_top_ptr = current_top_ptr ->next;
```

UNITED STATES PATENT AND TRADEMARK OFFICE
CERTIFICATE OF CORRECTION

PATENT NO. : 6,567,956 B1
DATED : May 20, 2003
INVENTOR(S) : Ted Scott Rakel

It is certified that error appears in the above-identified patent and that said Letters Patent is hereby corrected as shown below:

Column 6 (cont'd),

```
        }
        clear_tree_node_marks(top_of_tree_ptr);
} int calc_num_mutex_lists(list_head, mutex1)
node_pr list_head;
int mutex1;
{
    int total = 1;
    node_pr list_ptr = list_head;

while(list_ptr) {
        total = tota l * count_node_mutexes(list_ptr, mutex1);
        list_ptr = list_ptr->next;
    }
        return total;
} void append_to_mutex_list(mutex_list_head, list_head, num_appends, mutex1)
node_pr mutex_list_head, list_head;
int num_appends, mutex1;
{
    nodelinkptr keep_node_ptr;
    int nodes_this_relation, num_loops, l, j;

if (list_head == NULL) return;

nodes_this_relation = count_node_mutexes(list_head, mutex1);
    if (nodes_this_relation == 0) {
        complain("; ERC mutex processing found a mutex relation with 0 nodes\n");
        return;
    } if (list_head->next)
        append_to_mutex_list(mutex_list_head, list_head->next, num_appends, mutex1);

num_loops = num_appends / nodes_this_relation;
    for (j = 0, l = cckt_mutex_num; j < num_loops; j++) {
        keep_node_ptr = mutex1 ? list_head->mutex1 : list_head->mutex0;
        while(keep_node_ptr) {
            append_mutex_link(mutex_list_head + l++, keep_node_ptr->mutex_node, mutex1)
            keep_node_ptr = keep_node_ptr->next;
        }
    }
} void create_mutex_lists(mutex_list_head, list_head, num_mutex_lists, mutex1)
node_pr mutex_list_head, list_head;
int num_mutex_lists, mutex1;
{
    nodelinkptr keep_node_ptr;
    int nodes_this_relation, num_appends, l, keep_node_ptr = mutex1 ? list_head->mutex1 : list_head->mutex0;
    nodes_this_relation = count_node_mutexes(list_head, mutex1);
```

UNITED STATES PATENT AND TRADEMARK OFFICE
CERTIFICATE OF CORRECTION

PATENT NO.    : 6,567,956 B1
DATED         : May 20, 2003
INVENTOR(S)   : Ted Scott Rakel It is certified that error appears in the above-identified patent and that said Letters Patent is hereby corrected as shown below:

Column 6 (cont'd),

```
if (nodes_this_relation == 0) {
    complain(", ERC mutex processing found a mutex relation with 0 nodes\n");
    return.
}
num_appends = num_mutex_lists / nodes_this_relation;
while (keep_node_ptr) {
    for (I = ckt_mutex_num; I < ckt_mutex_num + num_appends; I++) {
        append_mutex_link(mutex_list_head + I, keep_node_ptr->mutex_node, mutex1);
    }
    append_to_mutex_list(mutex_list_head, list_head->next, num_appends, mutex1);
    ckt_mutex_num += num_appends;
    keep_node_ptr = keep_node_ptr->next;
}
} node_pr build_mutex_list(top_of_tree_ptr, mutex1)
dinodeptr top_of_tree_ptr;
int mutex1;
{
    node_pr list_ptr, list_head = NULL;
    int I, num_mutex_lists = 0;
    node_pr next_mutex_link, mutex_list_head = NULL;
    ckt_mutex_num = 0;

if (!ProcessMutex) return NULL;
    build_ckt_mutex_list(top_of_tree_ptr, &list_head, mutex1);
    if (list_head == NULL) {
        return list_head;
    }

/*From the circuit mutex list, construct the exhaustive list of all mutex node combinations */
    num_mutex_lists = calc_num_mutex_lists(list_head, mutex1);
    mutex_list_head = calloc(num_mutex_lists, sizeof(struct nynode));
    if (mutex_list_head == NULL) {
        erc_die("ERC: FATAL_ERROR: couldn't malloc\n");
        fatal_error(1);
    }
    for (I = 0, list_ptr = mutex_list_head; I < num_mutex_lists - 1; I++) {
        list_ptr->next = list_ptr + 1;
        list_ptr++;
    }
    create_mutex_lists(mutex_list_head, list_head, num_mutex_lists, mutex1);
    list_ptr = list_head;
    while (list_ptr) {
        next_mutex_link = list_ptr->next;
        free_node_mutex_list(list_ptr);
        ffree(list_ptr);
        list_ptr = next_mutex_link;
    }
    return mutex_list_head;
}

/* Given a list of nodes, find from this node the nodes which are mutually exclusive with the
given node. then set the ignore flag on each dinode. */
int ignore_mutex_fets(top_tree_ptr, mutex_list_head, mutex1);
```

Page 4 of 9

UNITED STATES PATENT AND TRADEMARK OFFICE
CERTIFICATE OF CORRECTION

PATENT NO. : 6,567,956 B1
DATED : May 20, 2003
INVENTOR(S) : Ted Scott Rakel

It is certified that error appears in the above-identified patent and that said Letters Patent is hereby corrected as shown below:

Column 6 (cont'd),

```
dinodeptr top_of_tree_ptr;
node_pr mutex_list_head;
int mutex1;
{
    dinodeptr node_in_tree;
    nodelinkptr keep_list, ignore_list;

if (mutex_list_head == NULL) return;

keep_list = mutex1 ? mutex_list_head->mutex1 : mutex_list_head->mutex0;
    while(keep_list) {
        ignore_list = mutex1 ? keep_list->mutex_node->mutex1 : keep_list->mutex_node->mutex0;
        while(ignore_list) {
            node_in_tree = find_gatenode_in_tree(top_tree_ptr, ignore_list->mutex_node)
            if (node_in_tree) node_in_tree->ignore = TRUE;
            ignore_list = ignore_list->next;
        }
        keep_list = keep_list->next;
    }
}

/* Given a list of nodes, find from this node the nodes which are mutually exclusive with the
given node.  Then set the mark flag on all the pass FETs connected to the nodes. */
int ignore_elem_mutex_fets(mutex_list_head, mutex1)
node_pr mutex_list_head;
int mutex1;
{
    elem_pr elem;
    nodelinkptr keep_list, ignore_list;

if (mutex_list_head == NULL) return;

keep_list = mutex1 ? mutex_list_head->mutex1 : mutex_list_head->mutex0;
    while(keep_list) {
        ignore_list = mutex1 ? keep_list->mutex_node->mutex1 : keep_list->mutex_node->mutex0;
        while(ignore_list) {
            for_gate_elems(elem, ignore_list->mutex_node) {
                if (EisPassFet(elem)) push_elem_set_mark(elem);
            } end_gate_elems
            ignore_list = ignore_list->next;
        }
    }
} node_pr build_elem_mutex_list_r(mutex_list, node, mutex1)
node_pr mutex_list, node;
int mutex1;
{
    nodelinkptr node_mutexes;
    node_pr passfet_gate, other_chan, next_node;
    elem_pr elem;

for_chan_fets(elem, node) {
```

UNITED STATES PATENT AND TRADEMARK OFFICE
CERTIFICATE OF CORRECTION

PATENT NO. : 6,567,956 B1
DATED : May 20, 2003
INVENTOR(S) : Ted Scott Rakel

It is certified that error appears in the above-identified patent and that said Letters Patent is hereby corrected as shown below:

Column 6 (cont'd),

```
            if (EisPassFet(elem) && !EisMarked(elem)) {
                push_elem_set_mark(elem);
                passfet_gate = Egate(elem);
                node_mutexes = mutex1 ? passfet_gate->mutex1 : passfet_gate->mutex0;
                /* gather this node's mutex information */
                if (node_mutexes) {
                    next_node = calloc(1, sizeof (struct mynode));
                    if (next_node == NULL) {
                        erc_die("ERC: FATAL_ERROR: couldn't malloc\n");
                        fatal_error(1);
                    }
                    append_mutex_link(next_node, passfet_gate, mutex1);
                    if (mutex_list) next_node->next = mutex_list;
                    mutex_list = next_node;
                }
                other_chan = EotherChan(elem, node);
                if ((NisMarked(other_chan) && ((EdirIsS2Ofoose(elem) && Nsame(Edrain(elem),
    other_chan)) || (EdirIsO2Sfoose(elem) && Nsame(Esource(elem), other_chan)))) {
                    push_node_set_mark(other_chan);
                    mutex_list = build_elem_mutex_list_r(mutex_list, other_chan, mutex1);
                }
            }
        } end_chan_fets
        return mutex_list;
    }

/* This looks for mutex relations on pass FETs connected to node. */
    node_pr build_elem_mutex_list(node, mutex1)
    node_pr node;
    int mutex1;
    {
        node_pr mutex_list = NULL;

if (!ProcessMutex) return NULL;

clear_elem_marks();
        push_node_set_mark(node);
        mutex_list = build_elem_mutex_list_r(mutex_list, node, mutex1);
        clear_node_marks();
        clear_elem_marks();
        return mutex_list;
    } void process_mutex_entry(log_line)
    character *log_line;
    {
        char nodename[MAXSTRING];
        char *nodelist;
        node_pr mutex_node_node, first_node;
        nodelinkptr mutex_link_inner, mutex_link_outer;
        int mutex1 = strstr(log_line, "mutex1 ") ? TRUE : FALSE;

find_node_list(nodelist, log_line);
        first_node = NULL;
```

UNITED STATES PATENT AND TRADEMARK OFFICE
CERTIFICATE OF CORRECTION

PATENT NO.    : 6,567,956 B1
DATED         : May 20, 2003
INVENTOR(S)   : Ted Scott Rakel It is certified that error appears in the above-identified patent and that said Letters Patent is hereby corrected as shown below:

Column 6 (cont'd),

```
/* Find the first non-dummy node in the list. */
while (sscanf(nodelist, "%s", nodename) != EOF) {
    nodelist += strlen(nodename) + 1;
    if (!strstr(nodename, dummy_mutex_node_name)) {
        first_node = NgetByName(nodename);
        if (first_node == NULL) {
            complain("ERC: PROG_ERR: mutex node '%s' is mentioned in file '%s', but
nodename, log_file);
            return
        }
        break;
    }
}
if (first_node == NULL) {
    complain("ERC: PROG_ERR: couldn't parse mutex section of logfile for first node\n");
    return;
}

/* The remaining non dummy nodes in the list will be added to a linked list of mutex nodes
for the first node. */
while (sscanf(nodelist, "%s", nodename) != EOF) {
    nodelist += strlen(nodename) + 1;
    if (!strstr(nodename, dummy_mutex_node_name)) {
        mutex_node_node = NgetByName(nodename);
        if (mutex_node_node == NULL) {
            complain("ERC: PROG_ERR: mutex node '%s' is mentioned in file '%s', but is
not used", nodename, log_file);
            return;
        }
        if (!exists_in_mutexlist(first_node, mutex_node_node, mutex1)) {
            append_mutex_link(first_node, mutex_node_node, mutex1);
        }
    }
}

/* The source node is setup, now copy information to all the target nodes */
mutex_link_outer = mutex1 ? first_node->mutex1 : first_node->mutex0;
while (mutex_link_outer) {
    if (!exists_in_mutexlist(mutex_link_outer->mutex_node, first_node, mutex)) {
        append_mutex_link(mutex_link_outer->mutex_node, first_node, mutex);
    }
    mutex_link_inner = mutex1 ? first_node->mutex1 : first_node->mutex0;
    while (mutex_link_inner) {
        if (!exists_in_mutexlist(mutex_link_outer->mutex_node, mutex_link_inner->mut
            append_mutex_link(mutex_link_outer->mutex_node, mutex_link_inner-
>mutex_n
        }
        mutex_link_inner = mutex_link_inner->next;
    }
    mutex_link_outer = mutex_link_outer->next;
}
}

/* Perform the Charge sharing N-stack query: cChargeShNStack. */
void charge_sharing_n_stack(top_of_tree_ptr, node)
```

UNITED STATES PATENT AND TRADEMARK OFFICE
CERTIFICATE OF CORRECTION

PATENT NO. : 6,567,956 B1
DATED : May 20, 2003
INVENTOR(S) : Ted Scott Rakel

It is certified that error appears in the above-identified patent and that said Letters Patent is hereby corrected as shown below:

Column 6 (cont'd),

```
dinodeptr top_of_tree_ptr;
node_pr node;
{
    double node_cap, eff_cap_below_node;
    dinodeptr local_top_ptr;
    nod_pr mutex_list_head_ptr, next_mutex_link, mutex_list_link;

/* Find the capacitance below the node */
    local_top_ptr = copy_fet_tree(top_of_tree_ptr);
    local_top_ptr = remove_scan_pass_fets(local_top_ptr, local_top_ptr);
    mutex_list_link = mutex_list_head_ptr = build_mutex_list(top_of_tree_ptr, TRUE);

do {
        ignore_mutex_fets(local_top_ptr, mutex_list_link, TURE);
        eff_cap_below_node = find_cap_below_node(local_top_ptr, local_top_ptr);
        node_cap = Ncap(node);

/* Calculate the ratio, and flag if out of bounds. */
        if (eff_cap_below_node > 0.0) {
            /* if the node is held, apply a different criterion than if not. */
            if (node_cap / eff_cap_below?node < MinChShNStackRatio_ERC) {
                ERC_error_node_("cChargeShNStack", node);
            }
        } else {
            if (node_cap / eff_cap_below_node < MinChShNstackRatioUnheld_ERC) {
                ERC_error_node_("cChargeShNStack", node);
            }
        }
        /* Clear marks in tree. */
        clear_tree_node_marks(local_top_ptr);
    }
    while (mutex_list_link = mutex_list_link ? mutex_list_link->next :NULL);

mutex_list_link = mutex_list_head_ptr;
    while (mutex_list_link) {
        next_mutex_link = mutex_list_link->next;
        free_node_mutex_list(mutex_list_link);
        mutex_list_link = next_mutex_link;
    }
    ffree(mutex_list_head_ptr);
    free_fet_tree(local_top_ptr, local_top_ptr);
}
```

UNITED STATES PATENT AND TRADEMARK OFFICE
CERTIFICATE OF CORRECTION

PATENT NO. : 6,567,956 B1 Page 9 of 9
DATED : May 20, 2003
INVENTOR(S) : Ted Scott Rakel It is certified that error appears in the above-identified patent and that said Letters Patent is hereby corrected as shown below:

<u>Column 6 (cont'd),</u>
Line 62, after "signal" delete the comma

Signed and Sealed this

Nineteenth Day of April, 2005

JON W. DUDAS
*Director of the United States Patent and Trademark Office*